(12) United States Patent
Kamidi et al.

(10) Patent No.: US 7,782,446 B2
(45) Date of Patent: Aug. 24, 2010

(54) STAGE SYSTEM AND LITHOGRAPHIC APPARATUS COMPRISING SUCH STAGE SYSTEM

(75) Inventors: Ramidin Izair Kamidi, Eindhoven (NL); Henrikus Herman Marie Cox, Eindhoven (NL); Ronald Casper Kunst, Eindhoven (NL); Youssef Karel Maria De Vos, Lile (BE)

(73) Assignee: ASML Netherlands B.V., Veldhoven (NL)

( * ) Notice: Subject to any disclaimer, the term of this patent is extended or adjusted under 35 U.S.C. 154(b) by 462 days.

(21) Appl. No.: 11/712,555

(22) Filed: Mar. 1, 2007

(65) Prior Publication Data

US 2008/0212054 A1 Sep. 4, 2008

(51) Int. Cl.
*G03B 27/62* (2006.01)
*G03B 27/58* (2006.01)
*G03B 27/42* (2006.01)
*G03B 27/32* (2006.01)

(52) U.S. Cl. .............. 355/75; 355/72; 355/53; 355/77

(58) Field of Classification Search ........... 355/72–75, 355/53, 77; 310/10, 12; 318/560, 565, 638, 318/640; 250/492.1, 492.2, 492.22, 548, 250/442.11
See application file for complete search history.

(56) References Cited

U.S. PATENT DOCUMENTS

| | | | | |
|---|---|---|---|---|
| 5,553,514 A | * | 9/1996 | Walkowc | 74/574.2 |
| 6,021,991 A | * | 2/2000 | Mayama et al. | 248/550 |
| 6,128,552 A | * | 10/2000 | Iwai et al. | 700/280 |
| 6,202,492 B1 | * | 3/2001 | Ohsaki | 73/662 |
| 6,471,435 B1 | * | 10/2002 | Lee | 403/220 |
| 6,473,159 B1 | * | 10/2002 | Wakui et al. | 355/53 |
| 6,495,847 B1 | * | 12/2002 | Asano et al. | 250/548 |
| 6,522,388 B1 | * | 2/2003 | Takahashi et al. | 355/53 |
| 7,126,674 B2 | * | 10/2006 | Butler | 355/72 |

(Continued)

FOREIGN PATENT DOCUMENTS

EP 1 744 216 A2 1/2007

OTHER PUBLICATIONS

EPO search report dated Jul. 17, 2008 for EPO application 08075140.7.*

(Continued)

*Primary Examiner*—Peter B Kim
*Assistant Examiner*—Christina Riddle
(74) *Attorney, Agent, or Firm*—Pillsbury Winthrop Shaw Pittman LLP

(57) ABSTRACT

A stage system for a lithographic apparatus includes a stage, an over-determined number of actuators to act on the stage, at least two sensors to measure a position dependent parameter of the stage and to provide a respective sensor signal. The at least two sensors are arranged to measure the respective position dependent parameters in a same degree of freedom. A controller is provided to provide a controller output signal to at least one of the actuators in response to a setpoint and the position dependent parameter as measured by at least one of the sensors. A further controller is provided with the position dependent parameters measured by the sensors. The further controller is configured to determine a difference between the position dependent parameters from the sensors and to provide a further controller output signal to at least one of the actuators in response to the determined difference.

31 Claims, 4 Drawing Sheets

U.S. PATENT DOCUMENTS

| | | | |
|---|---|---|---|
| 2001/0006762 A1* | 7/2001 | Kwan et al. | 430/311 |
| 2001/0055102 A1* | 12/2001 | Emoto | 355/53 |
| 2002/0001082 A1* | 1/2002 | Akimoto et al. | 356/400 |
| 2002/0101253 A1* | 8/2002 | Pletner et al. | 324/727 |
| 2002/0118346 A1* | 8/2002 | Galburt et al. | 355/53 |
| 2003/0071981 A1* | 4/2003 | Ueta | 355/72 |
| 2003/0098961 A1* | 5/2003 | Iwamoto | 355/72 |
| 2003/0164930 A1* | 9/2003 | Morisada | 355/53 |
| 2007/0214864 A1* | 9/2007 | Proksch | 73/1.79 |

OTHER PUBLICATIONS

Second Written Opinion issued in related Singapore Patent Application No. 200801309-6 mailed Sep. 11, 1009.

* cited by examiner

STAGE SYSTEM AND LITHOGRAPHIC APPARATUS COMPRISING SUCH STAGE SYSTEM

BACKGROUND

1. Field of the Invention

The present invention relates to a stage system, a lithographic apparatus including such stage system and stage control method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Increasing demands on throughput of the lithographic apparatus, e.g. on an amount of wafers to be processed by the lithographic apparatus in a certain time period, require increasing speeds and accelerations of stages such as a substrate table or a mast table. Furthermore, demands on resolution and accuracy of the pattern to be projected by the lithographic apparatus onto the substrate increase, which translates into a tendency to increase a size of the mask, in combination with an increased demagnification factor of the projection optics, the increased size of the mask to be able to provide the required level of detail on the mask. On the one hand, requirements as to a high scanning speed necessitate to keep a weight of a stage as low as possible, while on the other hand, the stage need to be constructed such as to obtain a high stiffness, to avoid occurrence or excitation of resonance modes of the stage which tends to result in massive constructions. Even further, to be able to achieve a high internal stiffness, use is made of materials having a high stiffness, unfortunately having a small relative damping, resulting in a long time before internal vibrations have settled.

Inspecting some of the design criteria more in detail, servo disturbance rejection and tracking performance (settling behavior) may be improved by increasing bandwidth of a closed loop control system by means of a feedback controller. Internal structural resonances of the stage, which are always present, impose severe constraints on extent in which the closed-loop bandwidth can be increased. For this reason, considerable effort is put by control engineers during design of the stage into optimizing mechanics in such a way that these resonance frequencies are as high as possible, allowing a high bandwidth. Generally, based on specifications of the process, a required minimal bandwidth is selected. The mechanical design is then optimized, providing all resonances above this bandwidth. In general, this may imply stiff coupling between actuator and sensor positions, which may result in a relatively heavy construction. In order to design stiff constructions, high E-module materials are used, which are intrinsically badly damped. Due to variability in production of the stages, a controller has to be robust against variations in the plant dynamics. In general, it is desired to have a same controller design is used for all produced items of a particular stage, which also induces some conservatism, which again limits performance.

Throughput enhancement or in other words higher accelerations and small settling times may generally have a negative effect on the stage accuracy and thus overlay. Higher accelerations may cause higher internal dynamic vibrations (or deformations) of the stages, which may be intrinsically badly damped, possibly resulting in a deterioration of the stage accuracy as the settling time decreases. Furthermore also the disturbances on the stages and the environment (or the "silent world"), which are induced by the movement of the stages themselves due to cross-talk, may increase (e.g. the lens, immersion) which may also result in a deterioration of the stage accuracy.

Since vibrations and disturbances may become limiting for the stage accuracy and thus overlay as the throughput increases, it is desirable to solve or at least alleviate the above limitations and conflicting requirements.

Thus, given the high requirements on the throughput of the lithographic apparatus, conflicting requirements come into existence, which appear to result in an upper limit to the performance that can be achieved.

SUMMARY

It is desirable to enhance a dynamic performance of the stage.

According to an embodiment of the invention, there is provided a stage system for a lithographic apparatus including a stage, a plurality of actuators, the actuators to act on the stage, the actuators being overdetermined in an actuator degree of freedom, at least two sensors to measure a position dependent parameter of the stage and to provide a respective sensor signal, the at least two sensors being arranged to measure the respective position dependent parameters in a sensor degree of freedom, a controller to provide a controller output signal to at least one of the actuators in response to a setpoint and the position dependent parameter as measured by at least one of the sensors, and a further controller which is provided with the position dependent parameters as measured by the at least two of the sensors, the further controller to determine a difference between the position dependent parameters from the at least two of the sensors and to provide a further controller output signal to at least one of the actuators in response to the determined difference.

In another embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein at least one of the support and the substrate table includes a stage system. The stage system includes a stage, a plurality of actuators, the actuators to act on the stage, the actuators being overdetermined in an actuator degree of freedom, at least two sensors to measure a position dependent parameter of the stage and to provide a respective sensor signal, the at least two sensors being arranged to measure the respective position dependent parameters in a sensor degree of freedom, a controller to provide a controller output signal to at least one of the actuators in response to a setpoint and the position dependent parameter as measured by at least one of the sensors, and a further controller which is provided with the position dependent parameters as measured by the at least two of the sensors, the further controller to determine a difference between the position dependent parameters from the at least two of the sensors and to provide a further controller output signal to at least one of the actuators in response to the determined difference.

According to an embodiment of the invention, there is provided a stage control method including providing a plurality of actuators, the actuators to act on the stage, the actuators being overdetermined in an actuator degree of freedom; measuring a position dependent parameter of the stage by at least two sensors, each sensor to provide a respective sensor signal, the at least two sensors to measure the respective position dependent parameter in a sensor degree of freedom; determining a controller output signal in response to a setpoint and the position dependent parameter as measured by at least one of the sensors; providing the controller output signal to at least one of the actuators; determining a difference between the measured position dependent parameters from the at least two sensors; determining a further controller output signal in response to the determined difference; and providing the further controller output signal to at least one of the actuators.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
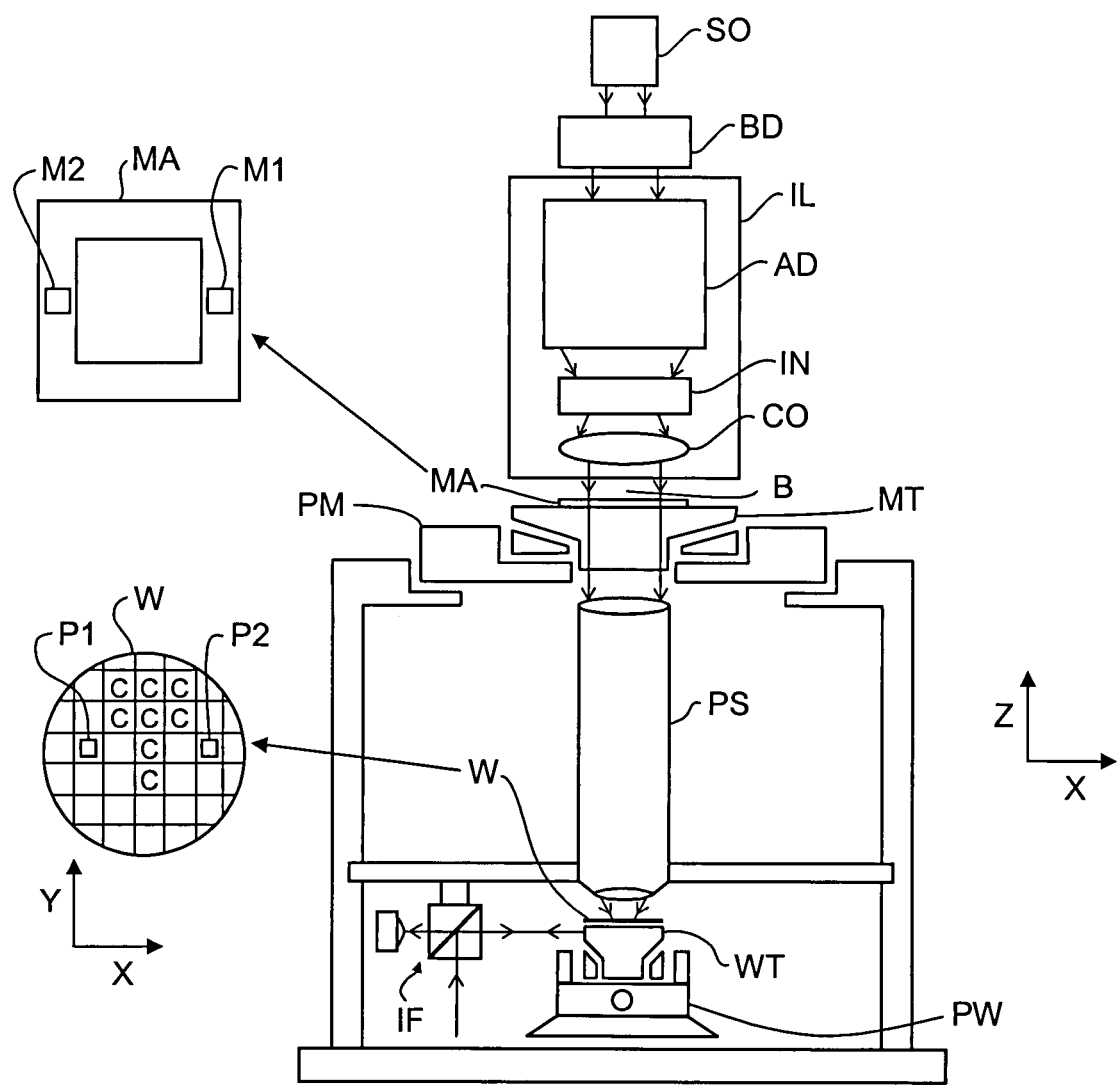
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure (e.g. a mask table) MT supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure (e.g. a mask table) MT can use mechanical, vacuum, electrostatic or other clamping techniques to hold the patterning device. The support structure (e.g. a mask table) MT may be a frame or a table, for example, which may be fixed or movable as required. The support structure (e.g. a mask table) MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table) MT, and is patterned by the patterning device. Having traversed the patterning device MA (e.g. mask), the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA (e.g. mask) with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device MA (e.g. mask) and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan-mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
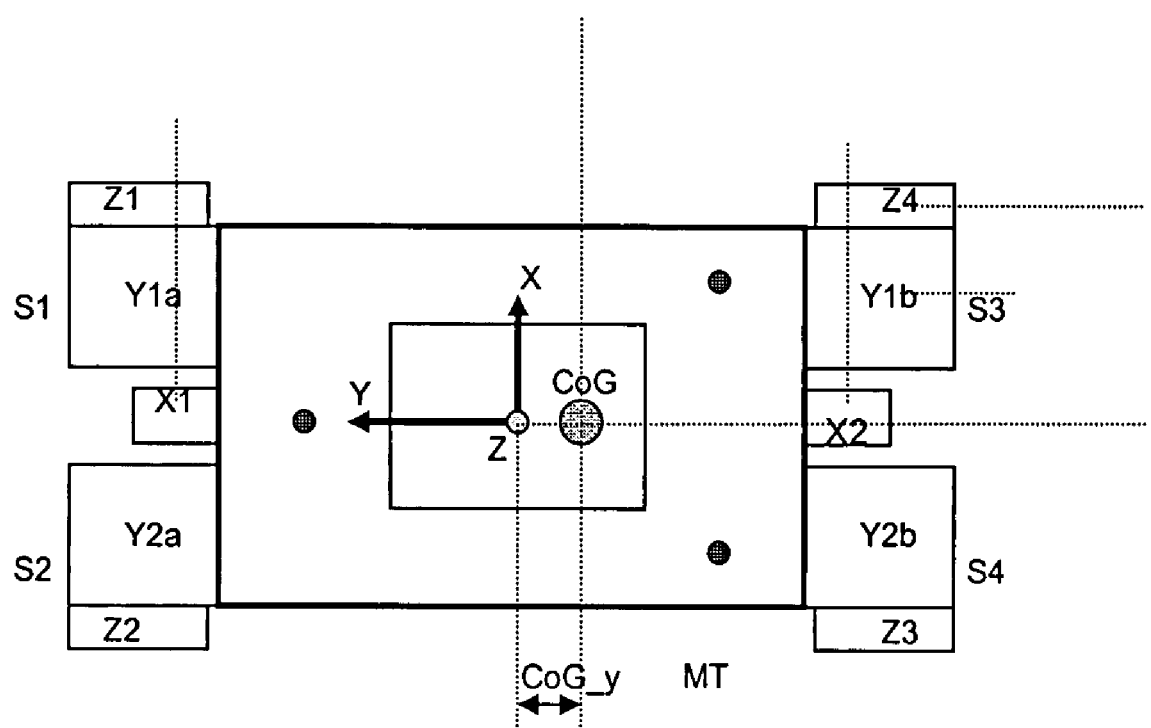
FIG. 2 depicts a schematic view of a stage according to an embodiment of the invention.

FIG. 2 shows a highly schematic view of a support structure (e.g. mask table) MT also referred to as support, to hold a patterning device. In FIG. 2, a top view is shown, i.e. a plane of drawing of FIG. 2 coincides with a plane of focus or a surface of the patterning device onto which the pattern has been provided. In FIG. 2, a scanning direction may be formed by the Y direction. A plurality of actuators are provided. In this embodiment, four actuators are provided to exert a force onto the support structure (e.g. mask table) in the scanning direction, these actuators being indicated by Y1a, Y1b, Y2a, Y2b. Also, two actuators X1, X2 are provided to exert a force on the support in X direction. Further, four actuators Z1, Z2, Z3 and Z4 are provided to exert a force on the support in a direction perpendicular to the plane of drawing of FIG. 2. The depicted configuration is symmetrical with respect to the X-direction as well as the Y-direction. In the embodiment depicted in FIG. 2, an improved dynamic behavior may be achieved, providing e.g. higher resonance frequencies, less position dependent dynamic behavior, which results in a higher bandwidth to be achieved. The four Y actuators (Y1a, Y1b, Y2a, Y2b) allow to achieve high accelerations in the Y direction, i.e. the scanning direction, which enables a high throughput.

By such configuration, the below effects may be achieved:

1] Symmetry along a scanning and a cross-scanning direction:

In general, the mode shapes (i.e. motion at a certain eigen frequency) of the stage have an orientation that will coincide with the direction of the principal axis of inertia. If the symmetry of the stage coincide with a measurement direction, the stage position sensors will measure in the direction of the modes. Then, these sensors will only see modes associated with the principal direction. If the symmetry-axes of the stage are not parallel to the measurement direction, the position sensors, will see all combinations of the modes, so the stage dynamics will become much more complex. So all actuators are placed at symmetric X,Y,Z positions.

2] Patterning device (e.g. mask or reticle) are in the center, so all motors are placed outside:

The radiation passes through the patterning device (e.g. mask or reticle), so there cannot be actuators or sensors at the patterning device position. Then, the motors of the support structure (or stage) are placed outside the patterning device and the support structure.

3] Very large forces in the scanning direction (=Y-direction):

The scan forces in Y-direction are very large, so a large actuator is desired. If only one Y-actuator is used, the stage becomes a-symmetric about the X-axis. Two Y-actuators at the front and back allow a large force and a symmetric construction.

4] Two X-actuators:

The X-motor are not placed at the center of gravity, because the patterning device is there. Applying two X-motors enables a "virtual X-motor" and/or a "virtual Rz-motor" in the centre of gravity of the support structure. Note that the Rz actuation can be done using only the X-motor, only the Y-motors, or using all X and Y-motors.

5] Solve over constrained DC-actuation:

The Y-motors may have the same actuation signal, so that they serve as one large "virtual Y-motor" in the centre of gravity of the support structure.

6] Four Z-motors:

Four Z-motors allow a "virtual Z-motor and Rx/Ry" in the centre of gravity CoG of the support structure.

FIG. 2 further shows a plurality of sensors, in this example sensors S2, S2, S3 and S4 each configured to measure a position of the support in the X direction.

The actuators may include any type of actuators, including e.g. a motor such as a linear motor, a piezo electric actuator, a pneumatic actuator or any other type of actuator. The sensors may likewise include any type of sensor, such as an interferometer, encoder, an acceleration sensor, velocity sensor, a torsion sensor, a strain gauge, a capacitive, inductive or other type of position sensor, velocity sensor, acceleration sensor, etc. Furthermore, although in FIG. 2 a support is shown, the embodiments described in this document may also be applied to any other stage, such as a substrate table, a liquid supply system, mask blades, etc. The position dependent parameter may include any type of position dependent parameter such as a position, a velocity, an acceleration, a jerk, etc. The position dependent parameter may thus include one or more of a position, a velocity, an acceleration, etc. The over-determined number of actuators may, but not necessarily, need to actuate in a same degree of freedom as the degree of freedom in which the at least two sensors, measuring the position parameter in a same degree of freedom, measure. Thus, the actuator degree of freedom may equal the sensor degree of freedom. The actuator degree of freedom and the sensor degree of freedom may each include at least one of the X, Y or Z direction, and/or a rotation with respect to the X, Y or Z direction.

Figure 3:
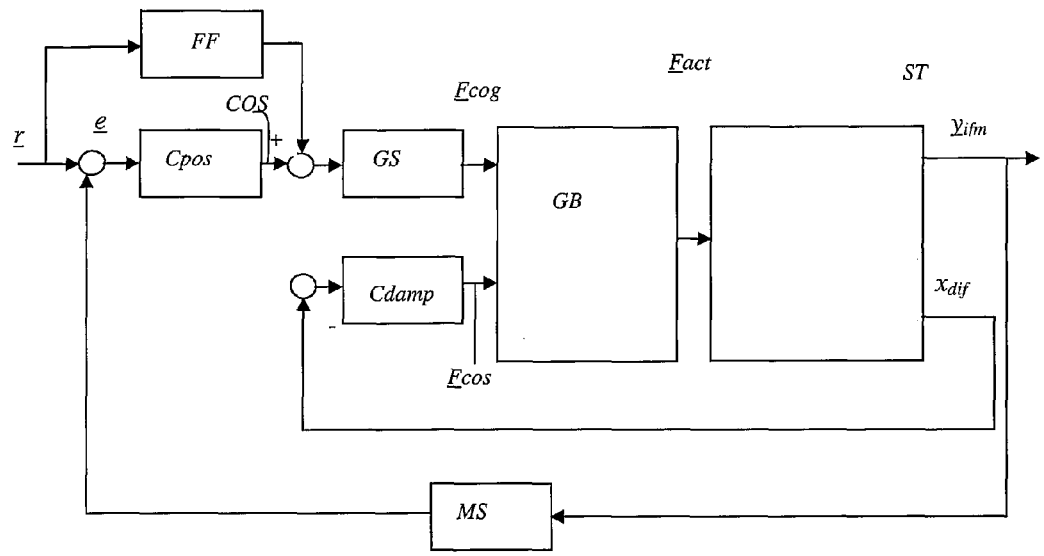
FIG. 3 depicts a control diagram of a stage control according to an embodiment of the invention.

FIG. 3 depicts a control diagram of a position dependent parameter of the stage, the stage having been indicated schematically by ST, and may include a mask table such as the support structure (e.g. mask table) MT depicted in FIG. 2, a substrate table WT, or any other stage. A position dependent parameter, in this example a position in Y direction, is controlled. Thereto, a setpoint r is provided to a control loop. Naturally, the position dependent parameter may also include any other position dependent parameter, such as a velocity, acceleration, jerk, or any combination thereof. The setpoint may include a single-dimensional or multi-dimensional setpoint: an example of the latter being a setpoint in six degrees of freedom. A closed loop control loop is formed by controller $C_{pos}$, gain scheduling matrix GS, gain balancing matrix GB, stage ST and measurement MS. The matrix GS may transform the scan-position dependent controller forces into forces at the center of gravity, the GB matrix may balance the forces at the center of gravity $F_{COG}$ into physical motor forces $F_{act}$. The controller $C_{pos}$ is provided with an error signal e which forms a difference between the setpoint r and an output signal of the measurement system MS. A controller output signal COS is provided to the stage ST via the gain scheduling matrix GS and the gain balancing matrix GB. As the measurement system MS, such as an interferometer, encoder, etc. measures a position dependent parameter, in this example the position of the stage, the measurement system in this example including an interferometer, the error signal e provided to the controller $C_{pos}$ is formed by a difference between the setpoint signal r and the output signal of the measurement system, thus representing the position as measured by the measurement system MS. The measurement system may measure the position of the stage in six degrees of freedom, such position being schematically denoted in FIG. 2 by $y_{ifm}$. FIG. 3 further shows a feedforward FF configured to provide a feedforward signal to the stage ST via the gain scheduling matrix GS and gain balancing matrix GB; the feedforward being determined from the setpoint signal r. A bandwidth of this closed loop system (not yet taking into account the further controller C.sub..damp) may in practice be limited by resonance frequencies of the stage. The bandwidth of the control loop will, in practical cases, be kept below such resonance frequencies, as instability, overshoot, or similar effects may occur otherwise, which will increase a settling time of the stage, thereby deteriorating a performance of the lithographic apparatus.

Since vibrations and disturbances become limiting for the stage accuracy and thus overlay as the throughput increases, it is desirable to increase the bandwidth of the closed-loop system and reduce or damp these vibrations (resonances). Particularly, the latter activity may be beneficial for a couple of reasons. Firstly, these vibrations which generally are high frequencies are not suppressed by the controller since sensitivity may equal to one for high frequencies. Secondly, when resonances are damped higher bandwidths may be obtained since the magnitude of resonances and variations in plant dynamics decreases. Finally, optimization of the bandwidth and feed forward using advanced control techniques (e.g. $H_\infty$ optimization, Iterative Learning Control, etc.) will not automatically give a best overlay performance due to the resonance modes of the stage. The reason for this is that generally the controlled position (non-collocated control) does not physically coincide with the exposed position, since the patterning device position may not be directly measured (the patterning device is positioned on the support structure and the support structure is measured in such a way that Abbe measurement-errors are as small as possible).

As further depicted in FIG. 3, a further controller $C_{damp}$ is provided which provides a further controller output signal FCOS via the gain balancing matrix GB to the stage ST. It is noted that the terms "controller", respectively, "further controller" providing "a controller output signal", respectively, "a further controller output signal" to the stage may be interpreted as the "controller", respectively the "further controller" providing a "controller output signal", respectively a "further controller output signal" to actuators of the stage, which actuators are able to, under control of or driven by the respective signal, exert a force on the stage, or provide for a displacement, position, velocity, etc. of the stage by a corresponding actuation. The further controller $C_{damp}$ is provided with position dependent parameters as measured by at least two sensors. The at least two sensors being arranged to measure the respective position dependent parameters in a same degree of freedom, i.e. in a same direction or with respect to a same axis of rotation. In FIG. 3, the at least two sensor output signals have been indicated by $x_{dif}$. In a stationary or static state of the stage, the further controller output signal FCOS may have no substantial effect on the stage, as in such stationary state a difference between the output signals of the sensors which measure the position in the same degree of freedom, will be a known constant or zero, depending on the type of sensors applied. Thus, as long as the stage ST may be considered a rigid body, the feedback provided via the controller of the $C_{pos}$ and the measurement system MS, provides for a controlling of the stage. In case that a resonance mode of the stage would be excited, a difference between the position dependent parameters as provided by the at least two sensors measuring in the same degree of freedom, will deviate from the previously mentioned constant or zero value, the controller in response thereto providing a further controller output signal FCOS via the gain balancing matrix GB to the stage. As an over-determined number of actuators have been provided, as explained above with reference to FIG. 2, the actuators may be actively involved in a suppression of the resonance mode which has been excited. As an example, in case that the Y actuators Y1, Y2 would tend to resonate in the X direction with respect to a frame of the support structure (e.g. mask table) MT, possibly in combination with a resonance of the frame of the support structure (e.g. mask table) MT itself, a suitable actuation of the X-actuators may assist in at least partly suppressing or actively damping such resonance mode.

The language "the actuators being over-determined in a degree of freedom" is to be understood as providing more actuators than would strictly be necessary for actuation in such degree of freedom in case that the stage would be a rigid body. As an example, one actuator (or one actuator at each side) would suffice to actuate the stage to provide for a translation in a direction. By providing more actuators acting in such direction, effects provided in case of resonances, torsion modes etc. of the stage, can be counteracted by a suitable driving of these actuators. Over-actuation may be defined as a providing and/or driving of more actuators (and possibly sensors) than would be needed in a "rigid-body" motion controlling an over-actuated stage may thus be provided with an over-determined number of actuators, i.e. a larger number of actuators than the number of degrees of freedom in which the stage would be actuated in the "rigid-body" motion controlling approach. As explained above, a stiffness of the stage may thereby be actively influenced. In fact, the control loop formed by the sensors $x_{dif}$ and the further controller $C_{damp}$ assists in damping a resonance modus of the stage, as by using at least two sensors in a same degree of freedom, an occurrence of resonance phenomena in that particular degree of freedom may be detected, the further controller in response thereto driving the actuators of the stage in order to attempt to dampen or influence the resonance phenomena as detected. Thereto, an over-determined number of actuators is preferred so that forces can be provided onto the stage at different positions, hence enabling to provide a pattern of forces that at least partly counteracts a particular resonance mode of the stage.

The over-determined number of actuators may provide further benefits, as it may also serve to keep the stage symmetrical, to improve dynamic behavior and increase throughput and by enabling a higher acceleration thereof.

Further, a centre of gravity CoG of the stage may deviate from a reference or centre thereof of which the position in parameter is to be controlled. The over-determined number of sensors and actuators, as depicted in FIG. 2, may be applied to reduce or remove discrepancies that might occur according to the state of the art by a difference between the centre of gravity and the reference or centre of the stage of which the position dependent parameter is to be controlled.

The gain balancing matrix GB may be considered a matrix configured to provide a relation between the controller output signals at the centre of gravity (possibly of controllers and further controllers in various degrees of freedom) and the physical actuator drive signals of the stage. In this example, a total of ten actuators are provided. They may be provided with actuator drive signals from the control system as depicted in FIG. 3, possibly in addition from similar control loops in other degrees of freedom. In the case that only the control loop of FIG. 3 is provided, the gain balancing matrix GB may thus form a relation between the two controller output signals, i.e. the controller output signal and the further controller output signal and actuator drive signals of the ten actuators. As depicted in FIG. 3, a gain scheduling matrix GS is provided which may correct for the fact that a position measurement of the support structure (e.g. mask table) takes place at different parts of the support structure (e.g. mask table): as an example: dependent on the mask table Y position, not only the X translation of the centre of gravity CoG is measured, but also a rotation Rz with respect to the centre of gravity, an effect of the rotation depending on the Y position of the stage. The gain scheduling matrix may thus convert single or multi dimensional controller output signal(s) COS (possibly in combination with a feedforward output signal from feedforward FF) into control signals related to the centre of gravity CoG. Gain Scheduling thus de-couples the position dependent control forces. During scanning, information on the patterning device (e.g. mask or reticle) are sequentially copied to the substrate. So the point of control of the support structure is varied during scanning. GS then is a position dependent force transformation resulting in six decoupled axes, during all phases of the scanning process. The gain scheduling matrix and the gain balancing matrix provide examples of an actuator drive matrix. In general, the controller and the further controller may thus drive the actuators via any actuator drive matrix.

The at least two sensors, which measure in a same degree of freedom, may be located at any suitable position. At least one of the sensors may be located at a position wherein a resonance mode of the stage at high amplitude will occur, e.g. where an anti node will occur, as at that position, a relatively high amplitude of a resonant wave is observed, thus providing for a relatively high signal component of the sensor in question, the particular signal component being caused by the resonance. To be able to provide a high sensor output signal difference with respect to the one of the sensors located at the anti node position, another one of the sensors may be located at a position where in the resonance mode of the stage a quiescent point of the resonant wave will occur, e.g. where a node will occur. The actuators may act at various parts of the stage. As the further controller may drive a plurality of the actuators, an effective damping of a resonance mode may be achieved when an actuator which is positioned to act on a part of the stage where an anti node may be formed in the resonance mode of the stage. It will be appreciated that actuators may also be positioned at other locations, e.g. at positions wherein the above mentioned reference mode of the stage a node will occur, so that different forces can be provided by the actuators on nodes and anti nodes to thereby attempt to actively damp the resonance mode.

A function is of the position sensors may be to measure the patterning device position with as small as possible Abbe (abberation)—errors. Thereto, minimally three horizontal and three vertical position sensors are desired. In a lithographic apparatus, two Y-encoders and one X encoder are provided, with rules on the support structure (e.g. chuck) and the encoder head on the lens, measuring the Chuck to Lens Top position in X, Y and Rz-direction. In Z-direction, four capacitive sensors are provided to measure the Z, Rx and Ry position of the Chuck to Lens.

The position sensors may be redundant. Therefore, extra position information about resonances can be measured. There may or may not be extra velocity or acceleration signals applied to measure the resonances.

In an embodiment, the sensors are positioned at a distance from each other (e.g. near outside edges of the stage) to allow an accurate measurement of e.g. rotational positions. Further, in an embodiment where the actuators include a motor such as a linear motor, it is preferred to keep the sensors some distance away from such actuators, as (electro) magnetic fields of the actuators may disturb an accurate operation of the sensors. This particularly holds for the Y-actuators, as high accelerations in the scanning direction needs large forces to be generated by such actuators, which may result in high magnetic fields.

The further controller may determine the difference between the two sensor signals of the two sensors in a same degree of freedom, by any suitable operation, such as subtraction. Also, the further controller may subtract a constant value from the obtained difference so as to result at a signal having a value which is substantially zero in case that no resonance modes occur.

Embodiments as described here not only assist in damping resonance modes of the stage but may also be applied instead of or in addition thereto to enhance a stiffness of the stage, e.g. reducing torsion or torsion modes thereof.

By the further controller as depicted in FIG. 3, a bandwidth of the control loop formed by the controller, in this example the position controller $C_{pos}$ may be increased which may result in faster, more accurate positioning of the stage or may allow to reduce a mass of the stage as the stage itself can be constructed having a lower stiffness: the further controller and its corresponding driving of the over-determined number of actuators to assist in enhancing an effective stiffness of the stage. As a further effect, the mass reduction of the stage may allow higher accelerations of the stage thereby providing a further factor to promote faster movements, higher accelerations and/or shorter settling times of the stage.

Figure 5:
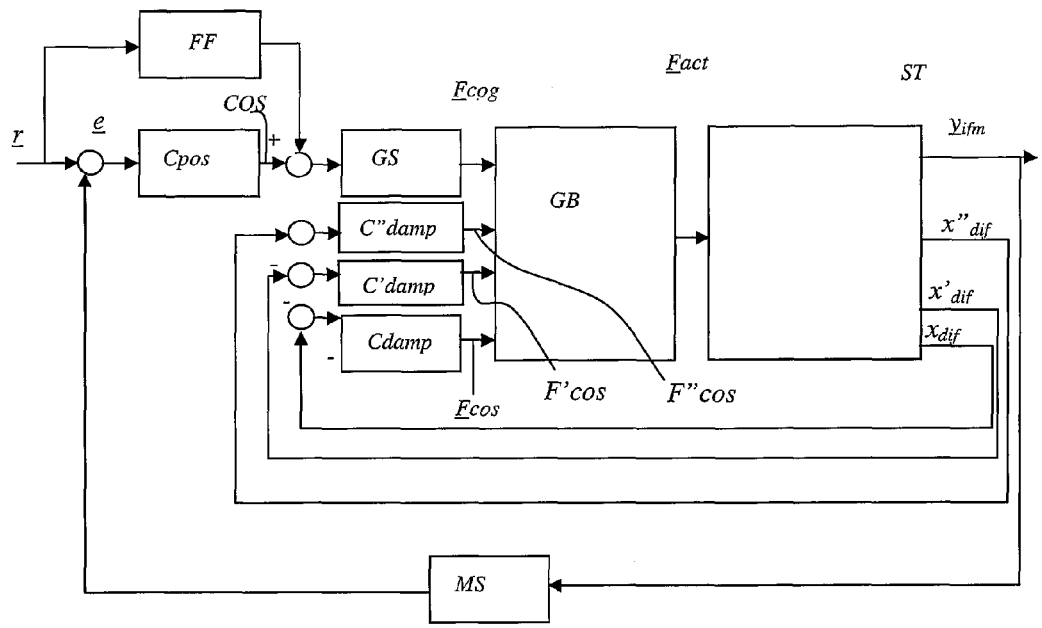
FIG. 5 depicts a control diagram of a stage control according to an embodiment of the invention.

Although in FIG. 3, a single control loop with a single further controller has been shown, a positioning of the stage may be performed by a plurality of control loops, each for a particular degree of freedom, a suitable further controller being provided for two or more of these control loops to thereby enable a damping of a resonance mode which excites the stage in more than one degree of freedom, or to dampen various resonance modes in different degrees of freedom. For example, FIG. 5 shows a stage controller including two further controllers $C'_{damp}$ and $C''_{damp}$, two sensor output signals $x'_{dif}$ and $x''_{dif}$ and further control output signals F'cos and F''cos.

Figure 4:
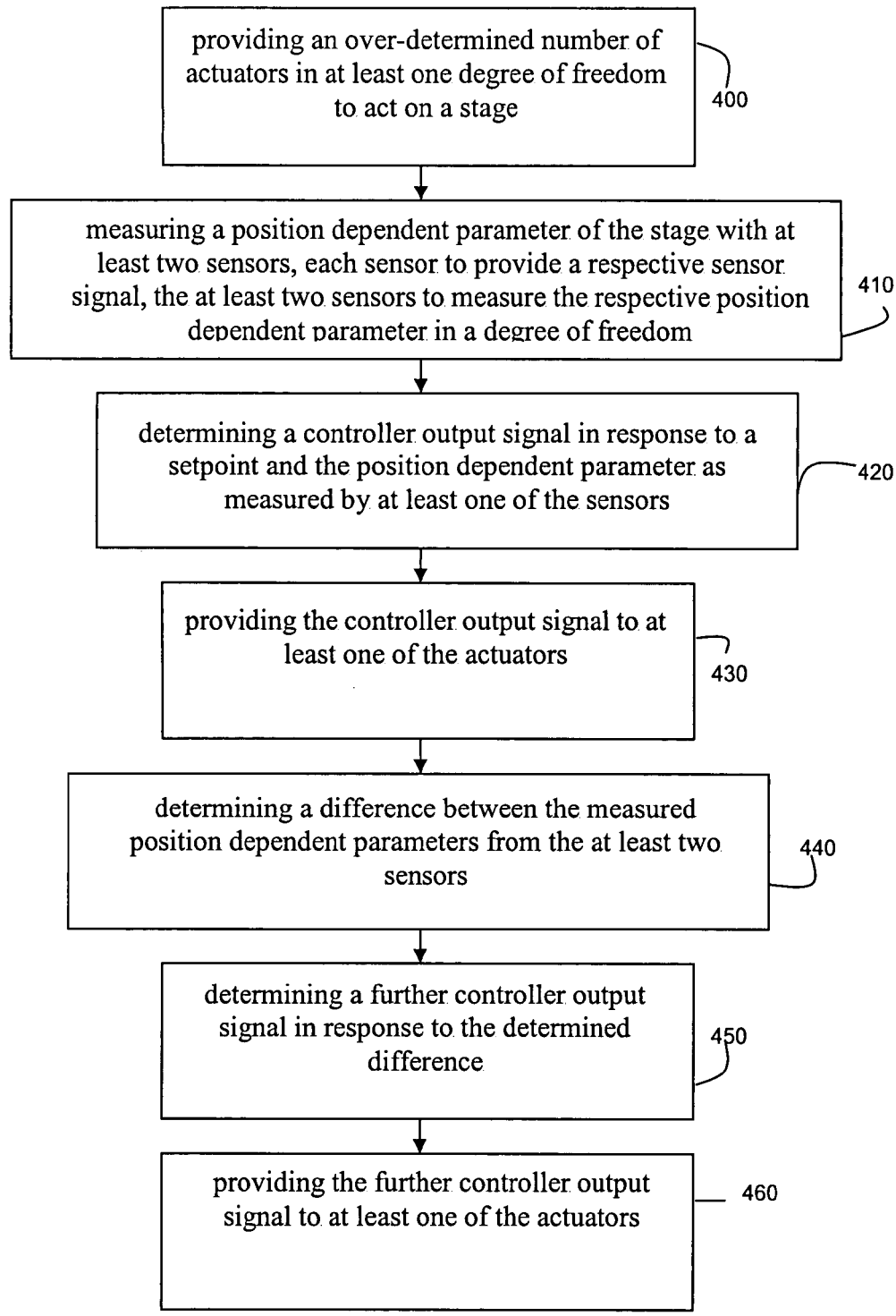
FIG. 4 depicts a flow diagram of a method according to an embodiment of the invention.

FIG. 4 shows a flow diagram of a stage control method according to an embodiment of the invention. In block 400, an over-determined number of actuators (in at least one degree of freedom) is provided to act on the stage. In block 410, a position dependent parameter of the stage is measured by at least two sensors, each sensor to provide a respective sensor signal, the at least two sensors to measure the respective position dependent parameter in a same degree of freedom. In block 420, a controller output signal is determined in response to a setpoint and the position dependent parameter as measured by at least one of the sensors. In block 430, the controller output signal is provided to at least one of the actuators. In block 440, a difference is determined between the measured position dependent parameter from the at least two sensors. In block 450, a further controller output signal is determined in response to the determined difference. Then, in block 460, the further controller output signal is provided to at least one of the actuators. Similar benefits, embodiments and further features as described above with reference to the stage and lithographic apparatus according to an embodiment of the invention may also be applicable to the method according to an embodiment of the invention.

An embodiment of the method may be described as:

1]: measure actual six degrees of freedom (DoF) patterning device position and provide positions as a controller input, 2] Compare actual six DoF position with position setpoint during scan and calculate controller error.

3] Calculate six DoF correction forces that will minimize controller error. Use Proportional, Integral, Derivative and Lowpass and Notch filters controllers. Apply setpoint feedforward forces to enable fast settling.

4] Transform six DoF controller forces into de-coupled six DoF forces at the centre of gravity to compensate for position dependency during scan.

5] In the "further controller" measure N-DoF resonance position, velocity or acceleration signal, use N-DoF available sensors or add extra sensors (N being 1, 2, 3, 4, 5 or 6)

6] In the "further controller" calculate N-DoF forces to damp to resonances using Proportional, Integral, Derivative and Lowpass and Notch filters controllers.

7] Add the output of the "further controller" to the centre of gravity forces from the normal controller.

8] CONTROLLER OUPUT: Transform all logical six DoF forces at the centre of gravity into six or more actuator control signals, that drive the amplifier for the physical motors Reverting to FIG. 3, the further controller may include any suitable type of controller, such as a PID (proportional-integrative-differential) controller, or any other type of controller such as an integrative controller, proportional controller, etc. The further controller may be implemented in suitable hardware such as analogue electronics or other control circuitry, however the controller may also be implemented in terms of software instructions which may be loaded into a suitable processing device, such as an already existing processing device of the lithographic apparatus. Similarly, the gain balancing matrix GB as well as the gain scheduling matrix GS as depicted in FIG. 3 may be formed by suitable hardware such as suitable analogue electronics, or by using suitable instructions to be executed by a processing device of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage system for a lithographic apparatus comprising:
    a stage;
    a plurality of actuators configured to act on the stage, the actuators being over-determined in an actuator degree of freedom;
    at least two sensors configured to each measure a position dependent parameter of the stage and to provide a respective sensor signal, the at least two sensors being arranged to measure the respective position dependent parameters in a sensor degree of freedom;
    a controller configured to provide a controller output signal to at least one of the plurality of actuators in response to a setpoint and the position dependent parameter as measured by at least one of the sensors; and
    a further controller provided with the position dependent parameters as measured by the at least two of the sensors, the further controller configured to determine a difference between the position dependent parameters from the at least two of the sensors, the determined difference being indicative of a resonance mode of the stage, and to provide a further controller output signal to at least one of the plurality of actuators in response to the determined difference, the at least one of the plurality of actuators being controlled by the further controller using the further controller output signal to reduce the resonance mode.

2. The stage system according to claim 1, wherein the controller and the further controller are configured to drive the plurality of actuators via an actuator drive matrix.

3. The stage system according to claim 1, wherein one of the at least two sensors is located at a position where a resonant wave excitation occurs when the stage is in the resonance mode.

4. The stage according to claim 3, wherein the resonant wave excitation is an anti node.

5. The stage system according to claim 3, wherein another one of the at least two sensors is located at a position where a resonant wave quiescent point occurs when the stage is in a resonance mode.

6. The stage according to claim 5, wherein the resonant wave quiescent point is a node.

7. The stage system according to claim 1, wherein the further controller is configured to provide the further controller output signal to one of the actuators positioned to act on a part of the stage where a resonant wave excitation is formed in the resonance mode of the stage.

8. The stage system according to claim 7, wherein the resonance wave excitation is an anti node.

9. The stage system according to claim 1, wherein at least two sets of at least two sensors and at least two further controllers are provided, each further controller configured to provide a further controller output signal in response to the input signals from the respective set of sensors.

10. The stage system according to claim 1, wherein the stage comprises
    a support configured to support a patterning device to impart a radiation beam of the lithographic apparatus with a pattern in its cross section,
    wherein the plurality of actuators comprise
        at least two scanning direction actuators, each scanning direction actuators arranged at an edge of the support to exert a force on the support in a scanning direction,
        at least two second direction actuators positioned at respective sides of the support to exert a force on the support in a second direction substantially perpendicular to the scanning direction and in a plane of focus of the lithographic apparatus, and
        at least three third direction actuators each positioned at an edge of the support to exert a force onto the support in a third direction substantially perpendicular to the plane of focus,
    wherein the stage system is controllable in six degrees of freedom with at least seven actuators.

11. The stage system according to claim 10, wherein the scanning direction actuators are attached to a front side of the support and the second direction actuators are attached to a back side of the support.

12. A lithographic apparatus comprising:
an illumination system configured to condition a radiation beam;
a patterning device support constructed to support a patterning device, the patterning device configured to impart the radiation beam with a pattern in its cross-section to form a patterned radiation beam;
a substrate support constructed to hold a substrate; and
a projection system configured to project the patterned radiation beam onto a target portion of the substrate;
wherein at least one of the supports is supported by a stage system comprising:
a stage;
a plurality of actuators configured to act on the stage, the actuators being over-determined in an actuator degree of freedom,
at least two sensors configured to each measure a position dependent parameter of the stage and to provide a respective sensor signal, the at least two sensors being arranged to measure the respective position dependent parameters in a sensor degree of freedom;
a controller configured to provide a controller output signal to at least one of the plurality of actuators in response to a setpoint and the position dependent parameter as measured by at least one of the sensors, and
a further controller provided with the position dependent parameters as measured by the at least two of the sensors, the further controller configured to determine a difference between the position dependent parameters from the at least two of the sensors, the determined difference being indicative of a resonance mode of the stage, and to provide a further controller output signal to at least one of the plurality of actuators in response to the determined difference, the at least one of the plurality of actuators being controlled by the further controller using the further controller output signal to reduce the resonance mode.

13. The lithographic apparatus according to claim 12, wherein the controller and the further controller are configured to drive the actuators via an actuator drive matrix.

14. The lithographic apparatus according to claim 12, wherein one of the at least two sensors is located at a position where a resonant wave excitation occurs when the stage is in the resonance mode.

15. The lithographic apparatus according to claim 14, wherein the resonant wave excitation is an anti node.

16. The lithographic apparatus according to claim 14, wherein another one of the at least two sensors is located at a position where a resonant wave quiescent point occurs when the stage is in the resonance mode.

17. The lithographic apparatus according to claim 16, wherein the resonant wave quiescent point is a node.

18. The lithographic apparatus according to claim 12, wherein the further controller is configured to provide the further controller output signal to one of the actuators positioned to act on a part of the stage where a resonant wave excitation is formed in the resonance mode of the stage.

19. The lithographic apparatus according to claim 18, wherein the resonance wave excitation is an anti node.

20. The lithographic apparatus according to claim 12, wherein at least two sets of at least two sensors and at least two further controllers are provided, each further controller configured to provide a further controller output signal in response to the input signals from the respective set of sensors.

21. The lithographic apparatus according to claim 12, wherein the plurality of actuators comprises
at least two scanning direction actuators, each scanning direction actuators arranged at an edge of the at least one of the supports to exert a force on the support at least one of the supports in a scanning direction,
at least two second direction actuators positioned at respective sides of the at least one of the supports to exert a force on the at least one of the supports in a second direction substantially perpendicular to the scanning direction and in a plane of focus of the lithographic apparatus, and
at least three third direction actuators each positioned at an edge of the at least one of the supports to exert a force onto the at least one of the supports in a third direction substantially perpendicular to the plane of focus,
wherein the stage system is preferably controllable in six degrees of freedom with at least seven actuators.

22. The lithographic apparatus according to claim 21, wherein the scanning direction actuators are attached to a front side of the at least one of the supports and the second direction actuators are attached to a back side the at least one of the supports.

23. A stage control method comprising:
providing a plurality of actuators that are configured to act on a stage, the plurality of actuators being over-determined in an actuator degree of freedom;
measuring a position dependent parameter of the stage with at least two sensors, each of the at least two sensors configured to provide a respective sensor signal, the at least two sensors configured to measure the respective position dependent parameter in a sensor of freedom;
determining a controller output signal in response to a setpoint and the position dependent parameter as measured by at least one of the sensors;
providing the controller output signal to at least one of the actuators;
determining a difference between the measured position dependent parameters from the at least two sensors, the determined difference being indicative of a resonance mode of the stage;
determining a further controller output signal in response to the determined difference;
providing the further controller output signal to at least one of the actuators, and
controlling the at least one of the actuators using the further controller output signal to reduce the resonance mode.

24. The method according to claim 23, wherein the actuators are driven by the controller output signal and the further controller output signal via an actuator drive matrix.

25. The method according to claim 23, wherein one of the at least two sensors is located at a position where a resonant wave excitation occurs when the stage is in the resonance mode.

26. The method according to claim 25, wherein the resonant wave excitation is an anti node.

27. The method according to claim 25, wherein another one of the at least two sensors is located at a position where a resonant wave quiescent point occurs when the stage is in a resonance mode.

28. The method according to claim 27, wherein the resonant wave quiescent point is a node.

29. The method according to claim 23, wherein the further controller is configured to provide the further controller output signal to one of the actuators positioned to act on a part of the stage where a resonant wave excitation is formed in the resonant mode of the stage.

30. The method according to claim 29, wherein the resonant mode is an anti node.

31. The method according to claim 23, wherein two sets of at least two sensors are provided, a respective further controller output signal being determined in response to the respective input signals from the respective set of sensors.

* * * * *